(12) United States Patent
Favennec et al.

(10) Patent No.: US 12,295,272 B2
(45) Date of Patent: May 6, 2025

(54) PHASE CHANGE MEMORY

(71) Applicant: STMicroelectronics (Crolles 2) SAS, Crolles (FR)

(72) Inventors: Laurent Favennec, Villard Bonnot (FR); Fausto Piazza, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 381 days.

(21) Appl. No.: 17/847,016

(22) Filed: Jun. 22, 2022

(65) Prior Publication Data

US 2023/0006132 A1 Jan. 5, 2023

(30) Foreign Application Priority Data

Jun. 30, 2021 (FR) ..................................... 2107027

(51) Int. Cl.
*H10N 70/20* (2023.01)
*H01L 23/522* (2006.01)
*H10B 63/10* (2023.01)
*H10N 70/00* (2023.01)

(52) U.S. Cl.
CPC ....... *H10N 70/231* (2023.02); *H01L 23/5226* (2013.01); *H10B 63/10* (2023.02); *H10N 70/011* (2023.02)

(58) Field of Classification Search
CPC .... H10N 70/231; H10N 70/011; H10B 63/10; H01L 23/5226
USPC .............................................................. 257/4
See application file for complete search history.

(56) References Cited

U.S. PATENT DOCUMENTS

| 10,644,069 | B2 * | 5/2020 | Jeong ................. G11C 13/0028 |
| 2006/0108667 | A1 | 5/2006 | Lung |
| 2014/0217350 | A1 | 8/2014 | Liu et al. |
| 2018/0233197 | A1 | 8/2018 | Laurent et al. |
| 2019/0140022 | A1 * | 5/2019 | Jeong ..................... H10B 61/10 |
| 2019/0363054 | A1 | 11/2019 | Min et al. |

* cited by examiner

*Primary Examiner* — Tu-Tu V Ho
(74) *Attorney, Agent, or Firm* — Seed IP Law Group LLP

(57) ABSTRACT

A method for making a phase change memory includes a step of forming an array of phase change memory cells, with each cell being separated from neighboring cells in the same line of the array and from neighboring cells in the same column of the array, by the same first distance. The method further includes a step of etching one memory cell out of N, with N being at least equal to 2, in each line or each column.

19 Claims, 6 Drawing Sheets

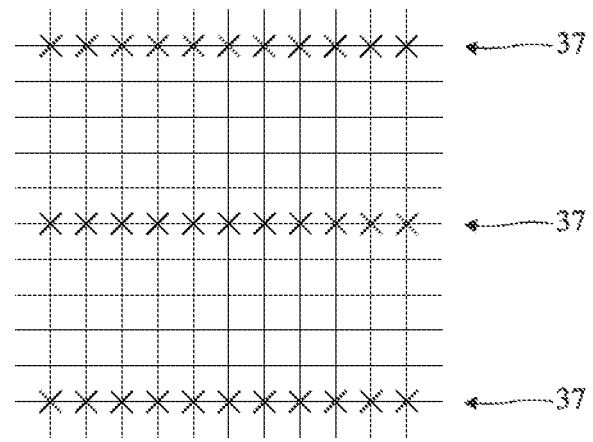
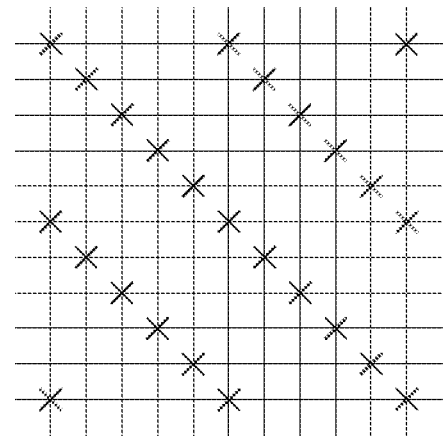
Fig 4

PHASE CHANGE MEMORY

BACKGROUND

Technical Field

The present disclosure relates to electronic devices in general, and, more particularly, to phase change memories.

Description of the Related Art

Phase change materials are materials that can switch between a crystalline and an amorphous phase when heated. Since the electrical resistance of an amorphous material is significantly higher than the electrical resistance of a crystalline material, this phenomenon can be used to define two memory states, such as 0 and 1, differentiated by the resistance measured through the phase change material.

BRIEF SUMMARY

At least one embodiment addresses all or some of the drawbacks of known phase change memories.

In at least one embodiment, the present disclosure provides a method for manufacturing a phase change memory comprising: a) a step of forming an array of phase change memory cells, each cell being separated from neighboring cells in the same line of the array and from neighboring cells in the same column of the array by a first distance, and b) a step of etching one memory cell out of N, where N is at least 2, in each line or each column.

According to one embodiment, N is equal to 5.

According to one embodiment, the method comprises, prior to step a), forming an array of conductive vias, each via being separated from the neighboring vias of the same line and from the neighboring vias of the same column of the array by a second distance.

According to one embodiment, step a) comprises forming a stack on the array of vias, comprising a layer of a resistive material, a layer of a phase change material and a conductive layer.

In one embodiment, step a) comprises etching the stack so as to delineate the cells of the array, each cell comprising a portion of the layer of resistive material, a portion of the layer of phase change material, and a portion of the conductive layer.

According to one embodiment, step b) comprises forming a cavity exposing the via on which each etched cell was formed.

According to one embodiment, step b) comprises etching lines of cells, the etched lines being separated from each other by N−1 lines of non-etched cells.

According to one embodiment, step b) comprises etching one cell out of N in each line and in each column.

According to one embodiment, the cells formed in step a) are identical.

Another embodiment provides a phase change memory comprising a plurality of phase change memory cells arranged in lines and columns, wherein each line or column comprises memory cell groups, with the cells in the same group being separated in pairs by the same first distance, the groups being separated in pairs by a third distance.

According to one embodiment, the third distance is equal to the sum of twice the first distance and the the memory cell dimension in the direction of the line or column.

Another embodiment provides for a memory as described above, obtained by the method described above.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which:

FIG. 4 illustrates schematically several arrangements of the cavities of the embodiment of FIG. 3;

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front," "back", "top," "lower," "left," "right," etc., or to relative positional qualifiers, such as the terms "above," "below," "upper," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

FIGS. 1-5 show steps, preferably successive steps, in one embodiment of a method for making a phase change memory. The phase change memory comprises a plurality of memory cells, each memory cell being configured to store data, for example, such as binary data. The memory cells are arranged in a cell array, comprising lines and columns. FIGS. 1-3 and 5 are in the plane of a line of the array, for example.

Figure 1:
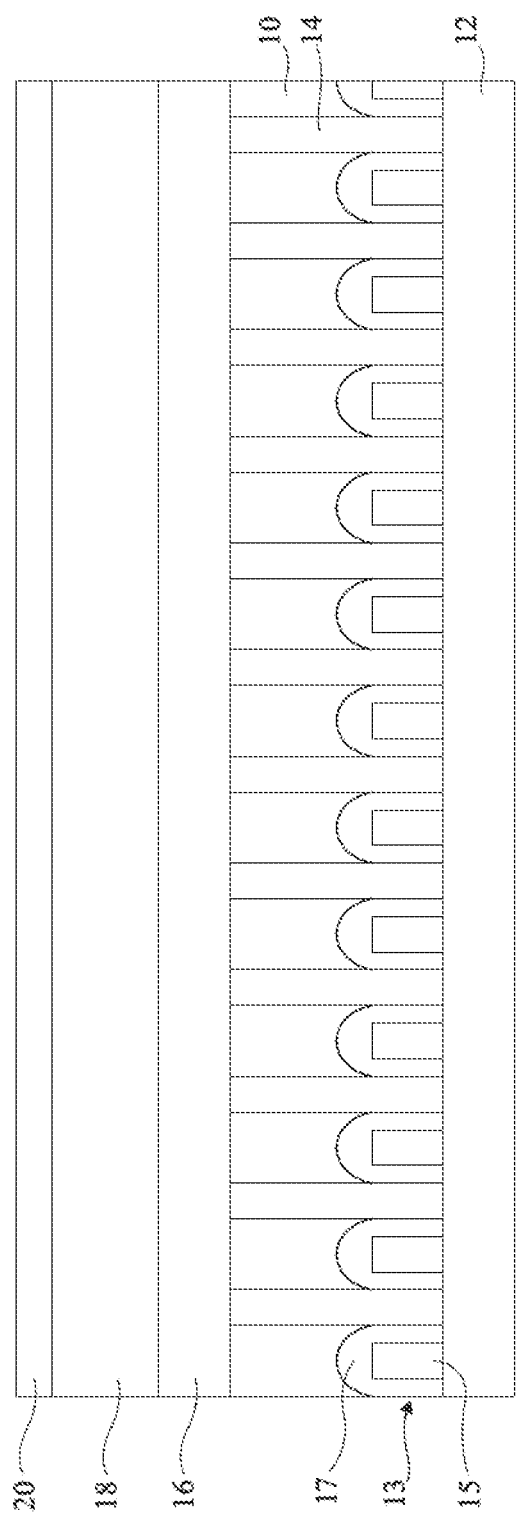
FIG. 1 shows a device resulting from one step of an embodiment of a method for manufacturing a phase change memory.

FIG. 1 shows a device resulting from a step in one embodiment of a method for making a phase change memory.

In this step, an insulating layer 10 is formed on a substrate 12. The substrate 12 is a semiconductor substrate, for example, such as silicon, or a semiconductor on insulator (SOI) substrate. The insulating or dielectric layer 10 is a single insulating layer, for example, or corresponds to a stack of insulating layers. The insulating layer/s of the layer 10 is/are made of one or more dielectric materials, such as silicon oxide or silicon nitride. In the following description, it is assumed that the layer 10 comprises a single insulating layer, for example.

Conductive vias 14 are formed through the layer 10. The vias 14 extend through the layer 10. In other words, the vias 14 extend from an upper side of the layer 10 to a lower side of the layer 10. The lower end of the vias is in contact with the substrate 12, for example. The upper end of the vias is preferably flush with the upper side of the layer 10.

The vias 14 are located regularly, i.e., periodically, in the layer 10. The vias 14 are located at the memory cell locations. The vias 14 thus form an array and form lines and columns. For example, FIG. 1 shows one line of the array. Each via 14 is separated from neighboring vias belonging to the same line or column by the same distance. Thus, each line or column of the array comprises vias 14 separated in pairs by this same distance.

Selection elements 13 are formed between the vias, for example. The selection elements are covered by an insulating layer 17, for example. In the example shown in FIG. 1, the selection elements are transistors, formed in and on the substrate 12. The transistors are illustrated by their gate 15. Neighboring transistors in the same line have a common drain or source region, for example. Transistors in the same line are thus connected in series by their drain and source regions, for example.

The lower end of each via 14 is in contact with a drain or source region of a transistor 13, for example.

A layer 16 of a resistive material is formed on the layer 10 and on the upper ends of the vias 14. For example, the layer 16 is of a conductive material, such as metal. For example, a layer 16 is formed on each line of the array. Each layer 16 is preferably separated from the layers 16 on the other lines by an insulating material, not shown. The assembly comprising the layers 16 and the insulating material separating them preferably forms a flat layer. Each layer 16 is in contact with the upper end of each via of the line. Each layer 16 is L-shaped, for example, in a plane such as a plane that is orthogonal to the plane of FIG. 1.

A layer 18 of a phase change material is formed over the layer 16, over the assembly comprising the layers 16 and the insulating material separating them, for example. The layer 18 is made of an alloy of germanium, antimony and tellurium (GeSbTe or GST), for example. The material of the layer 18 is doped, for example. In a variant, the material of layer layer 18 is undoped. The layer 18 preferably extends over all of the layers 16. Preferably, the layer 18 extends continuously across the entire array.

A conductive layer 20, of metal, for example, is formed on the layer 18. The conductive layer 20 covers the entire layer 18, for example.

Figure 2:
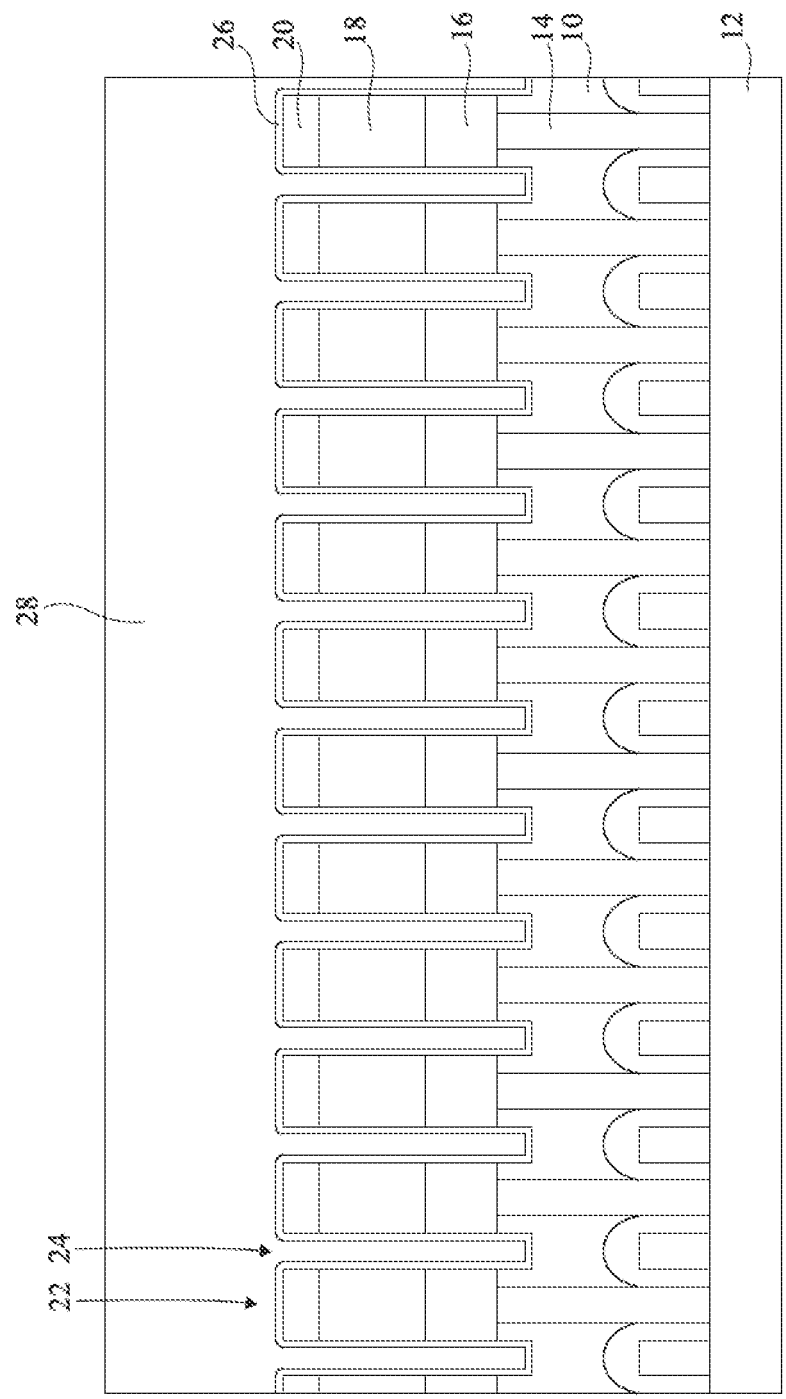
FIG. 2 shows a device resulting from another step of a method for manufacturing a phase change memory.

FIG. 2 shows a device resulting from another step of one embodiment of a method for making a phase change memory.

The step in FIG. 2 comprises an etching step, to delineate memory cells 22. In this step, cavities 24 are formed through the layers 16, 18, and 20 and, for example, in the layer 10. The cavities 24 are located between the cells 22. The cavities 24 extend in the direction of the lines of the memory cell array, for example, between the cells of different lines, and in the direction of the column of the memory cell array, between the cells of different columns. The cavities 24 thus form a grid or grid-like shape. The cavities are located opposite portions of the layer 10 that do not comprise a via 14, for example.

Each memory cell bounded by the cavities 24 is located opposite a via 14. In other words, the cavities 24 bound portions of the layers 16, 18, and 20. From a via 14, each memory cell 22 thus comprises a stack comprising a portion of the layer 16, forming a resistive element, a portion of the layer 18, and a portion of the layer 20, forming an upper electrode.

A memory cell array 22 is thus formed. In other words, cells arranged in lines and columns are formed. The cells 22 are substantially identical, i.e., the cell dimensions are substantially equal, two by two. More specifically, the memory cells are intended to be identical within manufacturing dispersions. The cells 22 are located regularly, i.e., periodically, in each line or column of the memory cell array. For example, FIG. 2 shows one line of the array. Each cell 22 is separated from each neighboring cell in the same line or column by the same distance. In other words, the distances separating the neighboring cells in the same line or column are substantially equal. Thus, each line or column of the array comprises cells 22 separated in pairs by this same distance.

The resulting structure is covered accordingly by a protective layer 26, of an insulating material, for example, such as silicon nitride. In particular, the layer 26 covers the walls and lower of the cavities 24 and the upper side of the memory cells. In other words, the layer 26 covers the layer 10, the side faces of portions of the layers 16, 18, and 20, and the upper side of portions of layer 20.

The structure is covered with a protective layer 28, for example, an insulating layer, for example, such as silicon oxide.

Figure 3:
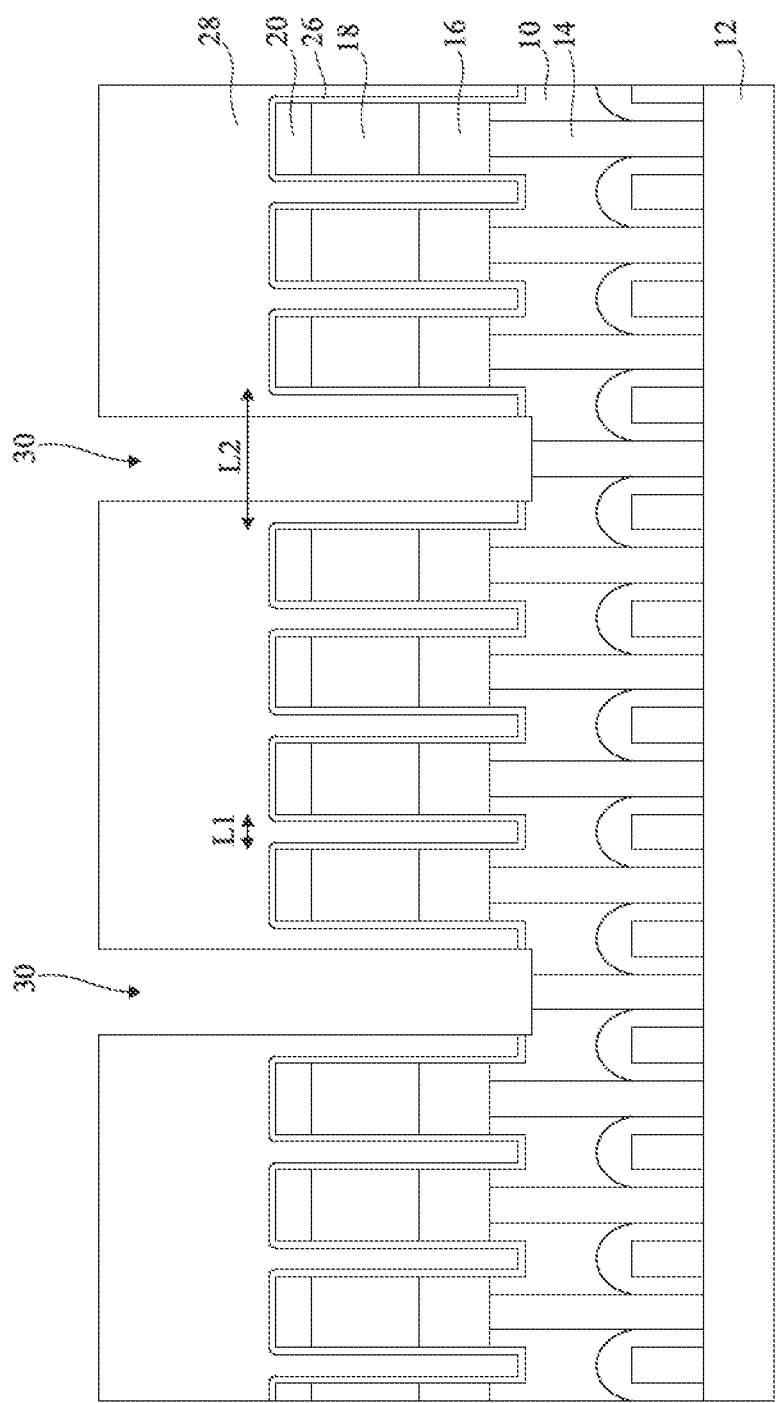
FIG. 3 shows a device resulting from another step of a method for manufacturing a phase change memory.

FIG. 3 shows a device resulting from another step in one embodiment of a method for making a phase change memory.

This step comprises a step of etching certain memory cells. In other words, the vias 14 corresponding to the memory cells etched in this step are uncovered by the etching step.

More specifically, cavities 30 are formed at certain memory cells of the array. Each cavity 30 opens at the upper side of the layer 28 and extends to the via 14. In particular, the portions of the layers 16, 18 and 20 of the cells etched in this step are removed entirely. The etching is preferably stopped in the layer 10. Thus, the layer 26 of each cell is separated from the layer 26 of the other cells by one of the cavities 30.

For example, the vias 14 are not etched. In other words, the cavity uncovers the vias 14 without etching them. For example, the layer 10 surrounding the vias is not etched. For example, the vias 14 are still surrounded by a portion of material of the layer 10 after the etching step.

For example, the cavity 30 does not extend the full height of the vias 14. In other words, the cavity 30 extends partially over the height of the layer 10, for example. The selection elements are not etched, for example. The cavity 30 does not reach the substrate 12.

In the example shown in FIG. 3, one cell out of N is etched. The value N is equal to 5 in the example of FIG. 3. Thus, in the example of FIG. 3, every fifth memory cell is etched and replaced by a cavity 30. In other words, each line, or column preferably comprises groups of N−1 cells, i.e., four cells here. Thus, each line comprises a succession of N−1 cells, a cavity 30, N−1 cells, a cavity 30, etc.

The cells of a same group are separated, two by two, by the same distance L1. In other words, the distances between two neighboring cells in the same group, located in the same line or column, are substantially equal. The groups are separated from each other by the cavities 30. The dimensions of the cavities 30 are less than the sum of twice the distance between two cells and the dimension of the cell in the same direction. Two neighboring cell groups are separated by the same distance L2. In other words, the cells closest to each other in two neighboring cell groups are separated by the distance L2. The distances separating the cells closest to each other of two neighboring cell groups are all substantially equal to each other, and substantially equal to the value L2. The distance L2 between two cells separated only by a cavity 30 is equal to the sum of twice the distance between two cells and the cell size in the same direction.

FIG. 4 illustrates schematically several example cavity arrangements of the embodiment of FIG. 3. FIG. 4 comprises views A and B, each corresponding to a possible arrangement of memory cells 22 and cavities 30.

Each view, A and B, illustrates a memory cell array schematically. In each view, A and B, the horizontal lines correspond to memory array lines and the vertical lines correspond to memory array columns. A memory cell is formed at each intersection of a line and a column. The memory cells etched in the step of FIG. 3 are illustrated as crosses at the corresponding intersections.

In the embodiment illustrated in view A, one cell out of N cells is etched in each column. The etched cells are part of the same lines. Thus, cell lines are etched. In other words, the cell array comprises lines 37 in which all memory cells were etched in the step of FIG. 3. The lines 37 are separated by N−1 lines in which no cells were etched during the step of FIG. 3.

The embodiment of view B differs from the embodiment of view A in that the etched cells are not part of the same lines. In other words, one out of N cells is etched in each column, with the etched cells in each column being in a different line than the etched cells, for example, in at least one of the neighboring columns. For example, the etched cells in each column are offset from the etched cells in the neighboring column by one line, preferably in the same direction.

According to one embodiment, a memory cell array may comprise multiple regions, with at least some regions having different arrangements.

Figure 5:
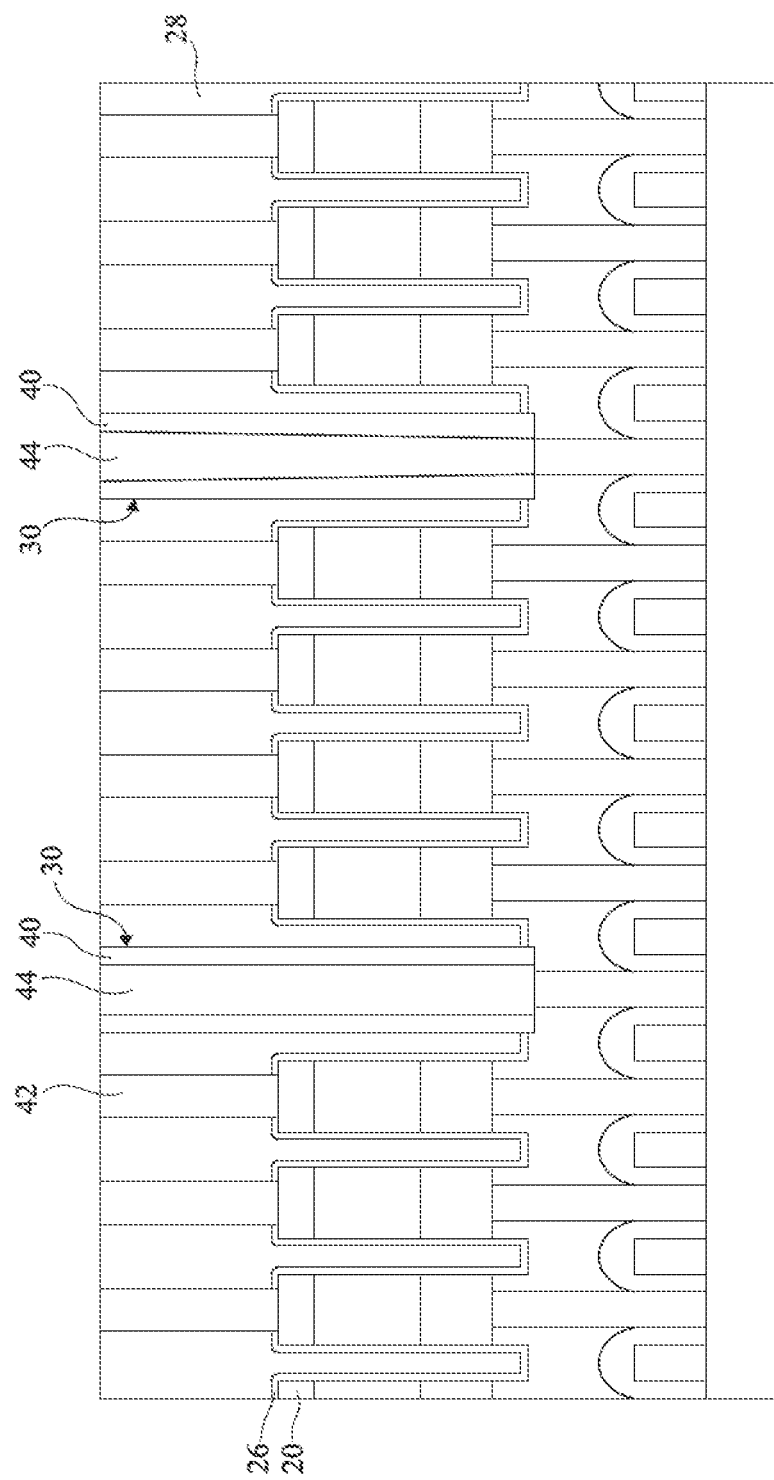
FIG. 5 shows a device resulting from another step of one embodiment of a method for manufacturing a phase change memory.

FIG. 5 shows a device resulting from another step of one embodiment of a method for making a phase change memory.

In this step, the cavities 30 are filled with an insulating material 40, of the same material as the layer material 28 for example.

This step further comprises the formation of vias. Vias 42 are formed so as to reach portions of the layers 20 of each memory cell. In other words, a via is formed opposite each cell. Each cell is thus in contact with a via 42 through the layer 20. Each via 42 extends from the upper side of the layer 28, through the layers 28 and 26, and reaches the layer 20.

Vias 44 are formed so as to reach the vias 14 opposite the cavities 30. In other words, a via 44 is formed in each cavity 30. The via 44 reaches, and is in contact with, the via 14 uncovered by the cavity 30. Each via 44 extends from the upper side of the material 40 to the via 14.

The vias 42 and 44 are made of conductive materials, of metal such as copper or tungsten for example.

When programming or reading a memory cell, a current is formed between the via 14 and the via 42 of the cell. The current flows through the via 44 closest to the cell and the selection elements between the cell and said via 44, for example, so as to reach the via 14.

Figure 6:
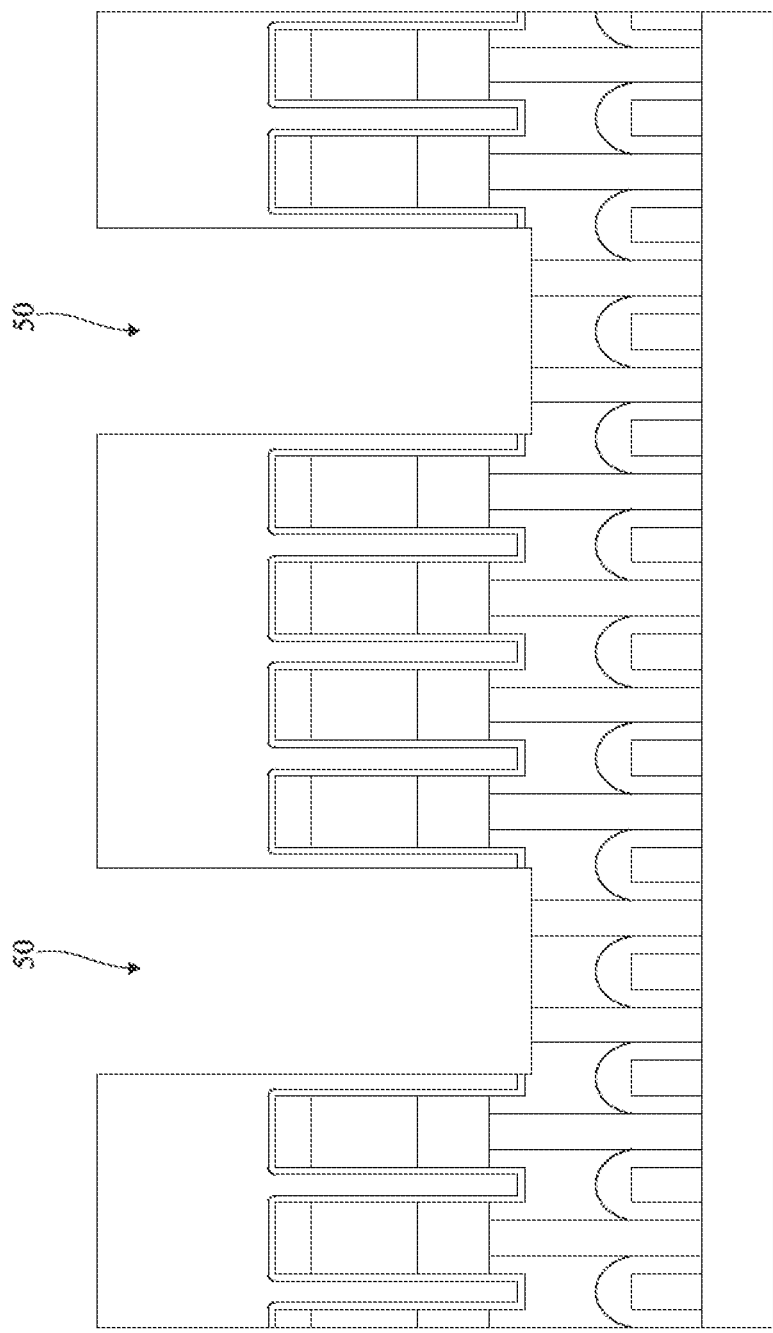
FIG. 6 shows a device resulting from an alternative step of the step of FIG. 3.

FIG. 6 shows a device resulting from a variant step of the step of FIG. 3.

Like the step in FIG. 3, this step comprises etching some memory cells. The step in FIG. 6 differs from FIG. 3 in that the cells are etched in groups of at least two cells, X cells, for example, where X is an integer at least equal to 2. In other words, the memory cells form groups of N−X cells, the groups being separated by a cavity 50 resulting from the etching of X memory cells.

The next step, not shown, corresponding to FIG. 5, differs in that the via 44 is in contact with the two uncovered vias, for example. The two vias are thus short-circuited.

One could have chosen to form only the cells that one wishes to keep and thus form the cavities separating the groups of cells during the formation of the memory cells. However, this would lead to differences in dimensions between cells in the same group, especially between cells located at the edges of the group and cells located inside the group.

One advantage of the described embodiments is the reduction of variations between different memory cells.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

A method for manufacturing a phase change memory may be summarized as including a) a step of forming an array of phase change memory cells, each cell being separated from neighboring cells in the same line of the array and from neighboring cells in the same column of the array, by a first distance, and b) a step of etching one memory cell out of N, where N is at least 2, in each line or each column.

N is equal to 5.

A method may be summarized as including prior to step a), forming an array of conductive vias, each via being separated from neighboring vias of the same line and from neighboring vias of the same column of the array, by a second distance.

Step a) may include forming a stack on the array of vias, comprising a layer of a resistive material, a layer of a phase change material, and a conductive layer.

Step a) may include etching the stack so as to delineate cells of the array, each cell including a portion of the layer of resistive material, a portion of the layer of phase change material, and a portion of the conductive layer.

Step b) may include forming a cavity exposing the via on which each etched cell was formed.

Step b) may include etching lines of cells, the etched lines being separated from each other by N−1 lines of unetched cells.

Step b) may include etching one cell out on N cells in each line and in each column.

The cells formed in step a) may be identical.

A phase change memory may be summarized as including a plurality of phase change memory cells arranged in lines and columns, wherein each line or column includes memory cell groups, the cells in the same group being separated in pairs by the same first distance, the groups being separated in pairs by a third distance.

The third distance may be equal to the sum of twice the first distance and the memory cell dimension in the direction of the line or column.

The memory may be obtained by the method.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing a phase change memory, comprising:
   forming an array of phase change memory cells, each cell being separated from neighboring cells in a same line of the array and from neighboring cells in a same column of the array, by a first distance; and
   etching one memory cell out of N, where N is at least 2, in each line or each column.

2. The method according to claim 1, wherein N is equal to 5.

3. The method according to claim 1, comprising:
   forming an array of conductive vias, each via being separated from neighboring vias of the same line and from neighboring vias of the same column of the array, by a second distance.

4. The method according to claim 3, wherein the forming the array of conductive vias is performed prior to the forming the array of phase change memory cells.

5. The method according to claim 3, wherein the forming the array of phase change memory cells includes forming a stack on the array of conductive vias, the stack including a layer of a resistive material, a layer of a phase change material, and a conductive layer.

6. The method according to claim 5, wherein forming the array of phase change memory cells includes delineating cells of the array by etching the stack, each cell including a portion of the layer of resistive material, a portion of the layer of phase change material, and a portion of the conductive layer.

7. The method according to claim 1, wherein the etching one memory cell out of N includes forming a cavity exposing a via on which each etched cell was formed.

8. The method according to claim 1, wherein the etching one memory cell out of N includes etching lines of cells, the etched lines being separated from each other by N−1 lines of unetched cells.

9. The method according to claim 1, wherein the etching one memory cell out of N includes etching one cell out on N cells in each line and in each column.

10. The method according to claim 1, wherein the cells of the array of phase change memory cells are identical.

11. A phase change memory, comprising:
    a plurality of phase change memory cells arranged in lines and columns, wherein each line or column includes memory cell groups, the cells in a same memory cell group being separated in pairs by a same first distance, the groups being separated in pairs by a second distance, the phase change memory obtained by the method according to claim 1.

12. The phase change memory according to claim 11, wherein N is equal to 5.

13. The phase change memory according to claim 11, the phase change memory further obtained by:
    forming an array of conductive vias, each via being separated from neighboring vias of the same line and from neighboring vias of the same column of the array, by a third distance.

14. The phase change memory according to claim 13, wherein the forming the array of conductive vias is performed prior to the forming the array of phase change memory cells.

15. The phase change memory according to claim 13, wherein the forming the array of phase change memory cells includes forming a stack on the array of conductive vias, the stack including a layer of a resistive material, a layer of a phase change material, and a conductive layer.

16. The phase change memory according to claim 15, wherein the forming the array of phase change memory cells includes delineating cells of the array by etching the stack, each cell including a portion of the layer of resistive material, a portion of the layer of phase change material, and a portion of the conductive layer.

17. The phase change memory according to claim 11, wherein the etching one memory cell out of N includes forming a cavity exposing a via on which each etched cell was formed.

18. The phase change memory according to claim 11, wherein the etching one memory cell out of N includes etching lines of cells, the etched lines being separated from each other by N−1 lines of unetched cells.

19. A phase change memory, comprising:
    a plurality of phase change memory cells arranged in lines and columns, wherein each line or column includes memory cell groups, the cells in a same memory cell group being separated in pairs by a same first distance, the groups being separated in pairs by a second distance, the second distance being equal to a sum of twice the first distance and a memory cell dimension in a direction of the line or column.

* * * * *